US012591151B2

(12) United States Patent (10) Patent No.: US 12,591,151 B2

Senellart Mardon et al. (45) Date of Patent: Mar. 31, 2026

(54) DEVICE FOR GENERATING SINGLE PHOTONS AND ENTANGLED PHOTON PAIRS

(71) Applicants: CENTRE NATIONAL DE LA RECHERCHE SCIENTIFIQUE, Paris (FR); UNIVERSITE PARIS CITE, Paris (FR); UNIVERSITE PARIS-SACLAY, Saint Aubin (FR)

(72) Inventors: Pascale Senellart Mardon, Orsay (FR); Hélène Ollivier, Ile-Tudy (FR); Loïc Lanco, Paris (FR)

(73) Assignees: CENTRE NATIONAL DE LA RECHERCHE SCIENTIFIQUE, Paris (FR); UNIVERSITE PARIS CITE, Paris (FR); UNIVERSITE PARIS-SACLAY, Saint Aubin (FR)

( * ) Notice: Subject to any disclaimer, the term of this patent is extended or adjusted under 35 U.S.C. 154(b) by 398 days.

(21) Appl. No.: 18/034,331

(22) PCT Filed: Oct. 20, 2021

(86) PCT No.: PCT/EP2021/079092
§ 371 (c)(1),
(2) Date: Apr. 27, 2023

(87) PCT Pub. No.: WO2022/090028
PCT Pub. Date: May 5, 2022

(65) Prior Publication Data
US 2023/0408853 A1 Dec. 21, 2023

(30) Foreign Application Priority Data

Oct. 28, 2020 (FR) ...................................... 2011044

(51) Int. Cl.
*H10H 20/812* (2025.01)
*G02F 1/017* (2006.01)
(Continued)

(52) U.S. Cl.
CPC ....... *G02F 1/01791* (2021.01); *H10H 20/812* (2025.01); *H10H 20/8142* (2025.01); *H10H 20/819* (2025.01)

(58) Field of Classification Search
CPC ..... B82Y 20/00; H01S 5/1042; H01S 5/3412; H01S 5/34; H10H 20/812; H10H 20/8142; H10H 20/819
See application file for complete search history.

(56) References Cited

U.S. PATENT DOCUMENTS 8,149,888 B1 * 4/2012 Schliwa ............... H10H 20/812
372/45.011
8,547,617 B2 * 10/2013 Bennett .................. B82Y 10/00
359/107
(Continued)

FOREIGN PATENT DOCUMENTS

WO 20111/089336 A1 7/2011

OTHER PUBLICATIONS

Trotta, Rinaldo, et al. "Energy-tunable sources of entangled photons: a viable concept for solid-state-based quantum relays." Physical review letters 114.15 (2015): 150502 (Year: 2015).*
(Continued)

*Primary Examiner* — Wyatt A Stoffa

(74) *Attorney, Agent, or Firm* — Maier & Maier, PLLC

(57) ABSTRACT

A device for generating photons includes a quantum box inserted into an optical cavity of micro-pillar type having at least one optical mode, the quantum box having at least one fundamental state and two states with one elementary excitation, the optical cavity having a bottom face and a top face, (Continued)

the bottom face bearing an electrical contact, the photon generation device advantageously comprises at least three electrical bonding pads electrically insulated from one another, arranged around the top face of the cavity.

13 Claims, 10 Drawing Sheets

(51) Int. Cl.
  H10H 20/814 (2025.01)
  H10H 20/819 (2025.01)

(56) References Cited

U.S. PATENT DOCUMENTS

| | | | | | |
|---|---|---|---|---|---|
| 9,219,191 | B2 * | 12/2015 | Bennett | ................ | H10H 20/812 |
| 11,881,533 | B2 * | 1/2024 | Moselund | ......... | H01L 21/02538 |
| 2010/0074293 | A1 * | 3/2010 | Lochmann | ................ | H01S 5/34 |
| | | | | | 438/22 |
| 2011/0108744 | A1 * | 5/2011 | Stevenson | .............. | H10H 20/81 |
| | | | | | 250/493.1 |
| 2011/0242632 | A1 * | 10/2011 | Bennett | .................. | B82Y 10/00 |
| | | | | | 977/774 |
| 2012/0076166 | A1 * | 3/2012 | Schliwa | .............. | H10H 20/812 |
| | | | | | 372/45.011 |
| 2018/0108804 | A1 * | 4/2018 | Ellis | ....................... | H10H 20/81 |
| 2019/0319429 | A1 * | 10/2019 | Ledentsov | .............. | H01S 5/141 |

OTHER PUBLICATIONS

Trotta, et al., "Highly Entangled Photons from Hybrid Piezoelectric—Semiconductor Quantum Dot Devices", Nano Letters 14.6, pp. 3439-3444, 2014.

Kowalik, et al., "Influence of an in-plane electric field on exciton fine structure inInAs—GaAs self-assembled quantum dots", Applied Physics Letters, 86 (4), 2005.

Somaschi, et al., "Near-optimal single-photon sources in the solid state", Nature Photonics, vol. 10, No. 5, pp. 340-345, 2016.

Nowak, et al., "Deterministic and electrically tunable bright single-photon source", Nat Communications, 2014.

Zeeshan, et al., "Proposed Scheme to Generate Bright Entangled Photon Pairs by Application of a Quadrupole Field to a Single Quantum Dot", arxiv.org., Cornell University, 2018.

Bennett, et al., "Electric-field-induced coherent coupling of the exciton states in a single quantum dot", Nature Physics, vol. 6, No. 12, pp. 947-950, 2010.

Moreau, et al., "Single-mode solid-state single photon source based on isolated quantum dots in pillar microcavities", Appl. Phys. Lett., vol. 79, No. 18, pp. 2865-2867, 2001.

Ollivier, et al., "Reproducibility of High-Performance Quantum Dot Single-Photon Sources", arxiv.org., Cornell University, 2019.

Dousse, et al., "Ultrabright source of entangled photon pairs", Nature, vol. 466, No. 7303, pp. 217-220, 2010.

* cited by examiner

600

601

Modify the resulting
electrical field

602

Measure the parameters
of interest of the
quantum box

700a

701a

Apply
electrical potential
differences

702a

Light the
quantum box

/ 700b

701b
Light the
quantum box

702b
Increase the fine
structure splitting
value

703b
Reduce the fine
structure splitting
value

/ 800

801
Reduce the fine
structure splitting
value

802
Populate the state with two
elementary excitations

DEVICE FOR GENERATING SINGLE PHOTONS AND ENTANGLED PHOTON PAIRS

CROSS-REFERENCE TO RELATED APPLICATIONS

This application is a National Stage of International patent application PCT/EP2021/079092, filed on Oct. 20, 2021, which claims priority to foreign French patent application No. FR 2011044, filed on Oct. 28, 2020, the disclosures of which are incorporated by reference in their entirety.

FIELD OF THE INVENTION

The present invention relates generally to the sources of photons and in particular to a device for generating single photons and entangled photon pairs, and methods implementing the device.

BACKGROUND

The deployment of a quantum communication network requires setting up of a source of single photons capable of generating a train of optical pulses in which each pulse comprises one, and just one, photon. Such sources are capable of providing two remote contacts with a secret key allowing them to encrypt subsequent communications. The imperfections of the propagation channel, be it optical fibers or free space, limit the range of such an application to a few hundreds of kilometers. The range of the quantum communication networks can be extended by means of quantum repeaters which rely on the entangling of a pair of photons. The generation of the pulses with a single photon or entangled photon pairs can be performed by means of emitters of nanometric size such that the transition between their electronic states corresponds to the radiation of a single quantum dipole.

Moreover, the creation of a quantum computer relies on systems that can be operated as quantum bits. A quantum bit is a coherent superposition of two basic states commonly denotes |0> and |1> such that it can take an infinity of possible values contrary to the binary bits manipulated by the conventional computers with values of 0 or 1. The quantum bits can be in the solid state or of photonic nature. While the first type offers flexibility in terms of storage and processing, the photonic quantum bits allow quantum information to be transported over long ranges. In order to allow the processing and the transportation of the quantum information, it is common practice to jointly use quantum bits in the solid state and photonic quantum bits in association with an interface between the two elements.

The use of the quantum boxes in applications including the deployment of a quantum communication network and the creation of a quantum computer has undergone major growth in recent years. The interest invested in such nanometric structures is explained by their similarities with the atom in terms of confinement of charge carriers and the quantification of their energy levels. Such characteristics allow a quantum box to generate a single photon through a process of spontaneous emission in response to a suitable light adaptation making it possible to have a electron migrate from the valency band to the conduction band. The same mechanism can be adapted to place two electrons in a same energy level of the conduction band and generate an entangled photon pair. The quantum boxes also allow a reliable interaction of the light with the characteristics of the confined charge carriers.

Isolated quantum boxes used as sources of single photons or of entangled photon pairs are generally limited in terms of brightness and bit rate. While the brightness quantifies the probability of having a single photon or an entangled photon pair per optical pulse, the bit rate measures the number of photons emitted per second and is equal to the product of the brightness as defined above and the rate of the clock of the emission governing the optical pulses which excite the quantum box. In order to improve the performance levels of the quantum boxes in terms of brightness and bit rate, it is known practice to insert the quantum box in a resonant optical cavity. Such a configuration makes use of the Purcell effect, also known by the expression "low light-material coupling system", to increase the spontaneous initial rate of the quantum box in the cavity mode and make it possible to more effectively collect the photons emitted by the quantum box. The encapsulation of the quantum box in an optical cavity also makes it possible to reduce the sensitivity of the quantum box to environmental disturbances (mechanical, electrical, or the like) and makes it possible to generate single photons that are indiscernible, that is to say identical in terms of quantum state (same frequency, same polarization state, same spatial and temporal distribution).

The quantum boxes are generally of semiconductor nature obtained by a molecular jet epitaxial method consisting in growing layers of different semiconductors in terms of gap energy and of mesh parameters. Such differences create quantum boxes of nanometric dimensions that are capable of confining charge carriers in the three dimensions of space.

An electron of the valency band of the quantum box can transit the conduction band to form, in association with the hole left in the valency band, an electron-hole pair, also called exciton. The formation of an exciton can be done by absorbing a photon of energy greater than or equal to the stop band of the material forming the quantum box. The exciton state corresponding to the formation of an exciton is an unstable state and the reestablishment of the neutral state, also called fundamental state, is done by the recombining of the electron with the hole with emission of a photon according to a spontaneous emission process characterized by a radiative life time of the order of a nanosecond and of an emission wavelength (or frequency) corresponding to the stop band of the material forming the quantum box.

A quantum box can confine a biexciton formed by two excitons coupled by coulombian interaction in sharing a same fundamental state. The level of energy of the biexciton state is greater than that occupied by that of a single exciton. The formation of a biexciton can be performed by successively absorbing two photons. The relaxation of a biexciton is performed also according to a spontaneous emission process which produces two photons emitted successively. The two photons are emitted at different wavelengths because the coulombian interaction is different according to whether one electron-hole pair or two electron-hole pairs are excited in the quantum box. Thus, the photon emitted upon the transition of the system from the biexciton state to the exciton state is of a wavelength different from that emitted upon the transition of the system from the exciton state to the neutral state.

The polarization state of the photon absorbed to form the exciton and that of the photon emitted upon the electron-hole recombination obey optical selection rules governed by the principle of Pauli exclusion and the conservation of angular moment. Such selection rules depend on the spin states of the electron-hole pair and state that the bright excitonic states emitting a photon upon their recombination are those corresponding to spin states of opposite signs. In the case where the quantum box has a cylindrical symmetry, the system exhibits two energy degenerate bright excitonic states. FIG. 1 represents the relaxation of a biexciton 103 formed in a semiconductor quantum box with cylindrical symmetry (or "isotropy") 100 in which only the bright excitonic states are implemented. The relaxation of a biexciton 103 confined in an isotropic quantum box 100 is performed in a system with three energy levels by successively emitting two photons. For that, two paths are possible:

- relaxation of the biexciton 103 to the exciton 1020 with emission of a right circular polarization photon, then relaxation of the exciton 1020 to the fundamental state 101 with emission of a left circulation polarization photon; or
- relaxation of the biexciton 103 to the exciton 1021 with emission of a left circular polarization photon, then relaxation of the exciton 1021 to the fundamental state 101 with emission of a right circular polarization photon.

Given that the two paths are indiscernible, because the excitons 1020 and 1021 are degenerate, that leads to the emission of a pair of polarization-entangled photons.

It should be noted that the generation of single photons can be performed by exploiting the recombination of the excitons 1020 or 1021 to the fundamental state 101 and that it is pointless, in this case, to pass through a biexciton state 103. The creation of a biexciton 103 is required for the generation of entangled photon pairs.

However, in practice, the semiconductor quantum boxes are anisotropic involving a lifting of degenerescence of exciton level, and therefore a loss of entanglement of the photons emitted. Such a lifting of degenerescence is primarily provoked by anisotropic effects of form of the quantum box, piezoelectric effects, mechanical constraints, etc. In an anisotropic quantum box, the bright excitonic states are separated by an energy quantity called "fine structure splitting" and are linear combinations of the basic states as defined in the symmetrical quantum boxes. The excitonic states in an anisotropic quantum box exhibit optical emissions that are linearly polarized along two specific axes "x" and "y" corresponding to the crystallographic directions (the axis "z" being the growth axis). FIG. 2 illustrates the recombination of a biexciton 203 in an anisotropic semiconductor quantum box 200. The relaxation of a biexciton 203 to the fundamental state 201 can be done only according to a linear polarization state on one of the specific axes of the quantum box, "x" or "y", by leaving an exciton 2020 or 2021 which, in turn, relaxes according to the same polarization state as the biexciton 203. The lifting of degenerescence of the exciton level leads to the total or partial loss of the entanglement between the two photons generated.

It is known practice to use anisotropic quantum boxes to generate single photons of improved performance levels by resonantly exciting a superpositioning of two bright excitonic states and by exploiting the change over time $\Delta\Phi$ of the phase between the two excitonic states polarized according to "x" and "y", the speed of which (called "transfer speed", because it governs the transition from a state of linear polarization of the emitted photons to an orthogonal state, as will be explained in more detail with reference to FIG. 10)

is proportional to the value of the fine structure splitting according to the following relationship:

$$\Delta\Phi = \exp\left(i\frac{\Delta_{FSS}}{\hbar}t\right),$$

$\hbar$ being the reduced Planck constant. The excitation can be done with photons polarized linearly on an axis that is not colinear with the specific axes of the quantum box, ideally with an orientation of 45 degrees. In order to collect only the photons generated by the quantum box, only the photons that are polarized linearly in the direction at right angles to that of the excitation photons are detected. Generally, the fine structure splitting value determines the performance levels of the source of single photons in terms of brightness and purity, the purity quantifies the capacity to generate a single photon during a same excitation period. The fine structure splitting value is difficult to control during the process of fabricating the quantum box. High fine structure splitting values make it possible to increase the speed of transfer and, consequently, increase the brightness of the source of single photons. However, the probability of the quantum box emitting more than one photon during a same light excitation period is not negligible which reduces the performance levels of the of single photons in terms of purity. Conversely, the low fine structure splitting values reduce the speed of transfer which reduces the probability of having a second photon emitted during a same excitation period. Such low fine structure splitting values improve the purity of the source of single photons to the detriment of the brightness which is degraded because the quantum box emits more rapidly in the polarization parallel to that of the excitation photons than in the orthogonal polarization. There is therefore a need to control the fine structure splitting value in order to generate single photons at a high rate while reducing the probability of having more than one photon emitted during one same period of excitation.

The use of the anisotropic quantum boxes as fabricated remains unsuited to the generation of entangled photon pairs because of the lifting of the degenerescence of the exciton state. There is therefore a need to statically reduce the fine structure splitting value, in particular cancel it, in order to reestablish the indiscernibility of the radiative emission paths from the biexciton to obtain entangled photon pairs.

It is known practice to reduce and/or control the fine structure splitting value in a quantum box by applying a vertical electrical field jointly with one or more strain fields, in this case of mechanical type, in two or three directions of the environment in which the quantum box is inserted. Such a solution has been demonstrated in [1]. The application of such strain fields entails thinning the substrates on which the quantum box is produced in order to place piezoelectric materials as close as possible to the quantum box and ensure that the mechanical tension applied is well transferred to the quantum box implemented. The thinning necessary to the implementation of such an approach poses technological challenges for the fabrication of a three-dimensional (3D) optical cavity incorporating a quantum box. Furthermore, the proximity of the quantum box with a surface makes it sensitive to the environmental disturbances which provokes the loss of indiscernibility of the single photons generated.

It is also known practice to apply an electrical field in two dimensions of the space in which the quantum box is inserted in order to control the fine structure splitting value. Such a solution is implemented in [2] by the insertion, on a plane very close to that of the quantum box, of several (typically four) electrical bonding pads. The proximity of the quantum box to surfaces where such electrical bonding pads are defined is known to increase the charge noise and reduce the performance levels of the photons emitted in terms of indiscernibility.

There is therefore a need for a source of single photons or of entangled photon pairs based on a semiconductor quantum box in which the fine structure splitting can be controlled statically or dynamically, without the drawbacks of the prior art.

SUMMARY OF THE INVENTION

To this end, the present invention provides a device for generating photons comprising a quantum box inserted into an optical cavity of micro-pillar type having at least one optical mode, the quantum box having at least one fundamental state and two states with one elementary excitation, the optical cavity having a bottom face and a top face, the bottom face bearing an electrical contact, characterized in that it comprises at least three electrical bonding pads electrically insulated from one another, arranged around the top face of the cavity.

In one embodiment, the electrical bonding pads can be linked to the top face of the cavity by semiconductor arms oriented radially with respect to the cavity and having, in a tangential direction and, at their end closest to the cavity, a width less that of the cavity.

In another embodiment, the electrical bonding pads can be linked to semiconductor arms oriented radially toward the cavity and of which the ends can be separated from the top face of the cavity by an empty gap, or one filled with dielectric, of submicrometric width.

Advantageously, the optical cavity of micro-pillar type can form a diode of P-I-N type, the quantum box being situated in an intrinsic region of the diode.

As a variant, the electrical bonding pads can be borne by respective pillars decoupled optically and electrically from the cavity.

In one embodiment, the device can further comprise at least three adjustable voltage sources for applying respective and variable potential differences between each of the electrical bonding pads and the electrical contact borne by the bottom face of the optical cavity.

In another embodiment, the optical cavity of micro-pillar type can have at least one first and one second pair of modes, each pair of modes being polarization degenerate, and wherein the quantum box can also have one state with two elementary excitations.

Advantageously, the device can further comprise a second optical cavity coupled to the optical cavity in which the quantum box is inserted, the geometry of the first cavity and of the second cavity and the force of their coupling being chosen such that the assembly composed of the two coupled cavities exhibits a first pair of modes that are polarization degenerate and resonant with the transitions between the state with two elementary excitations, the two states with one elementary excitation of the quantum box, and a second pair of modes that are polarization degenerate and resonant with the transitions between the two states with one elementary excitation and the fundamental state of the quantum box, the modes of each of the pairs having radiation patterns that overlap to 70% or more.

In particular, the second optical cavity can also be of micro-pillar type, the two cavities being arranged side-by-side.

A method is proposed for generating entangled photon pairs by means of a photon generation device, the method can comprise the following steps:

applying a potential difference between each of the electrical bonding pads and the electrical contact borne by the bottom face of the optical cavity, the potential differences being chosen to:

minimize the energy deviation between the two states with one excitation of the quantum box, and bring the transitions between the state with two elementary excitations and the states with one elementary excitation into resonance with the first pair of modes of the cavity, and the transitions between the states with one elementary excitation and the fundamental state into resonance with the second pair of modes of the cavity; and populate the state with two elementary excitations of the quantum box with an input of energy.

Also proposed is a method for generating single photons by means of a photon generation device, the method can comprise the following steps:

applying a potential difference between each of the electrical bonding pads and the electrical contact borne by the bottom face of the optical cavity, and lighting the quantum box of the device with a light pulse exhibiting a spectrum and a direction of polarization corresponding to a mode of the optical cavity, the potential differences being chosen to modify the energies of the two eigenstates with one elementary excitation in such a way that:

the states are resonant with wavelengths of the spectrum of the light pulse; and the probability of emission, by the box, of a single photon having a linear polarization orthogonal to that of the lighting is maximized.

In one embodiment, the potential differences can also be chosen to orient specific axes of the quantum box according to intermediate directions between those of two specific axes of polarization of the optical cavity.

In another embodiment, the potential differences can be variable in time and:

during a first period, during at least a part of which the quantum box is lit, take first values chosen for the energies of the two eigenstates with one elementary excitation to have a non-minimal deviation, the first period having a duration chosen to provoke a change of phase of between 45° and 135°, and preferably between 80° and 100°, between the two states; and during a second period, immediately succeeding the first period, take values chosen to minimize the deviation between the energies of the two eigenstates with one elementary excitation.

BRIEF DESCRIPTION OF THE DRAWINGS

Other features and advantages of the invention will become apparent from the following description and the attached drawings in which.

Figure 1:
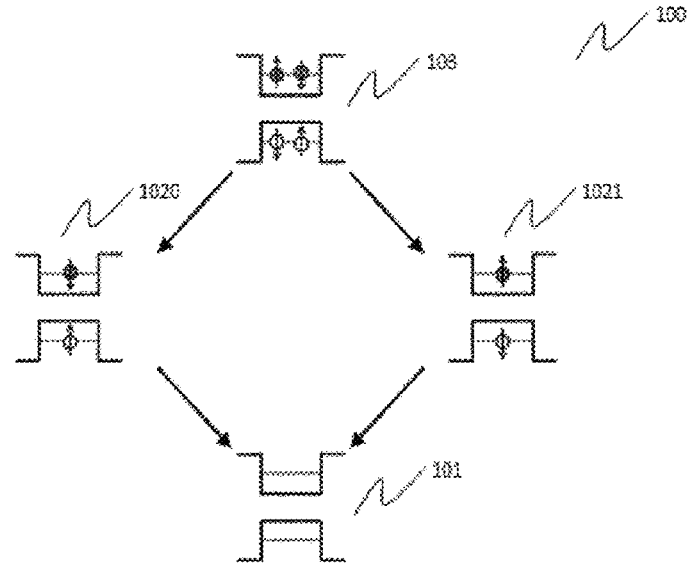
FIG. 1.
Figure 2:
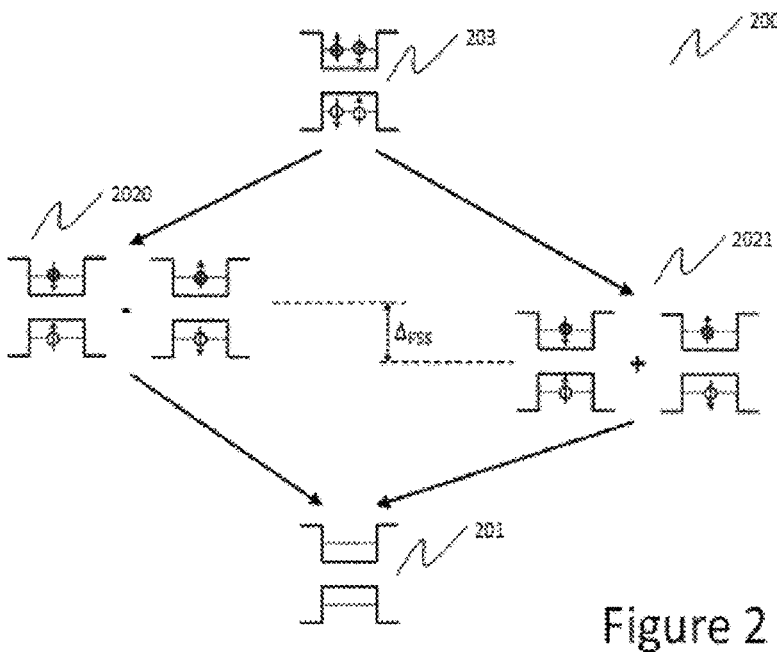

FIG. 2 described above, illustrate the relaxation of a biexciton in isotropic and anisotropic quantum boxes, respectively,

FIG. 3A and

Figure 3A:
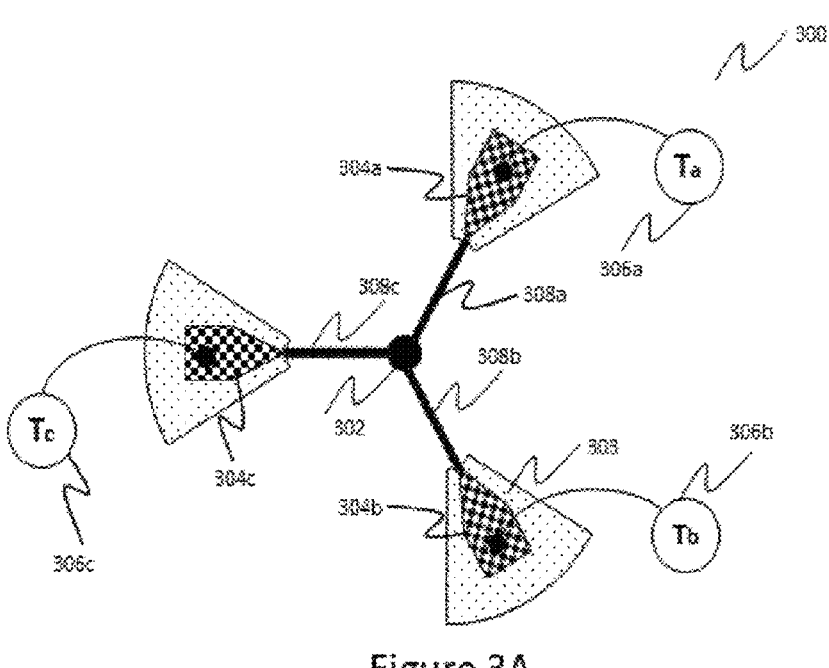
Figure 3B:
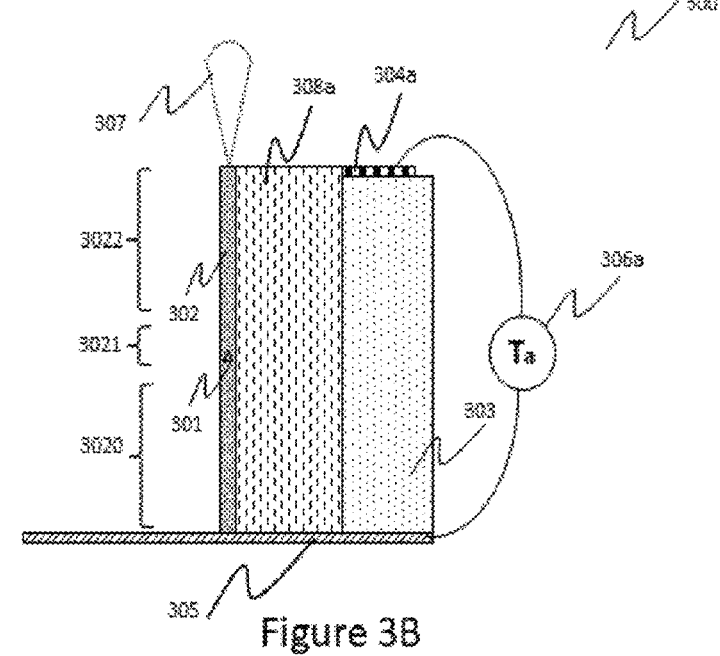
Figure 4:
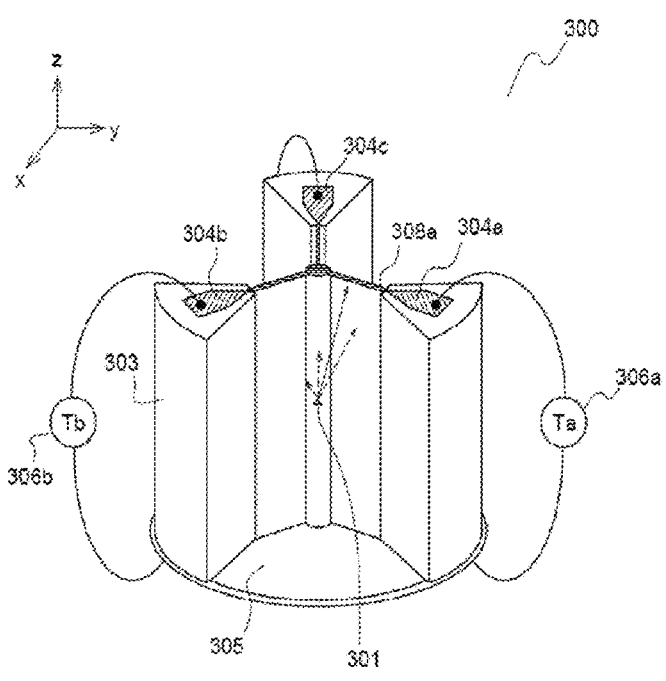

FIG. 3B represent a device for generating single photons and entangled photon pairs according to an embodiment of the invention, FIG. 4 illustrates the generation of an electrical field with three components in the space according to an embodiment of the invention,

FIG. 5,

FIG. 6 and

Figure 7:
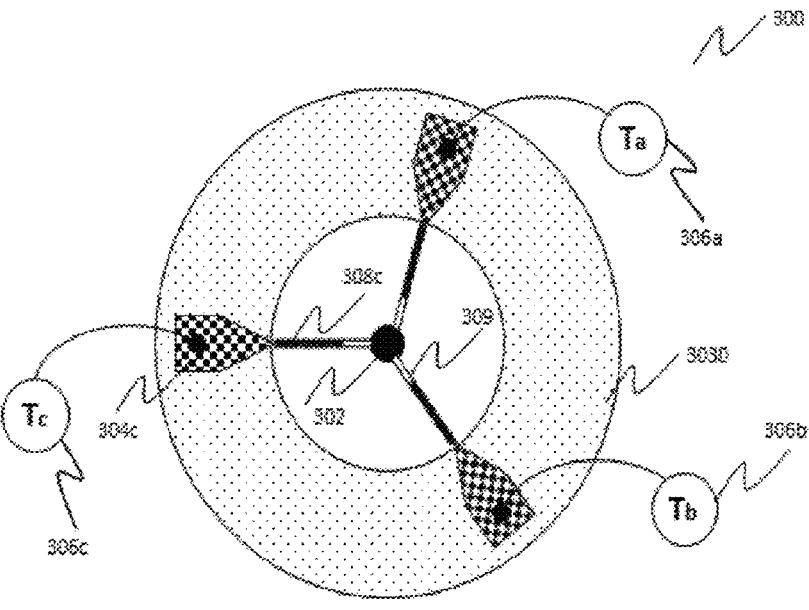
Figure 8:
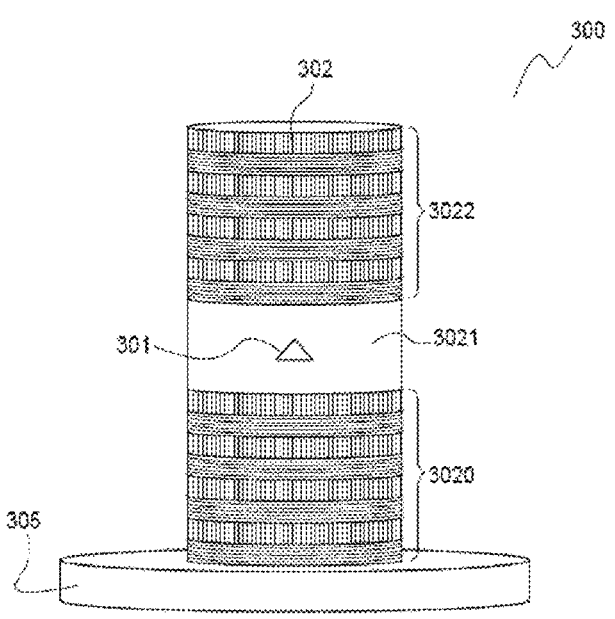
Figure 9:
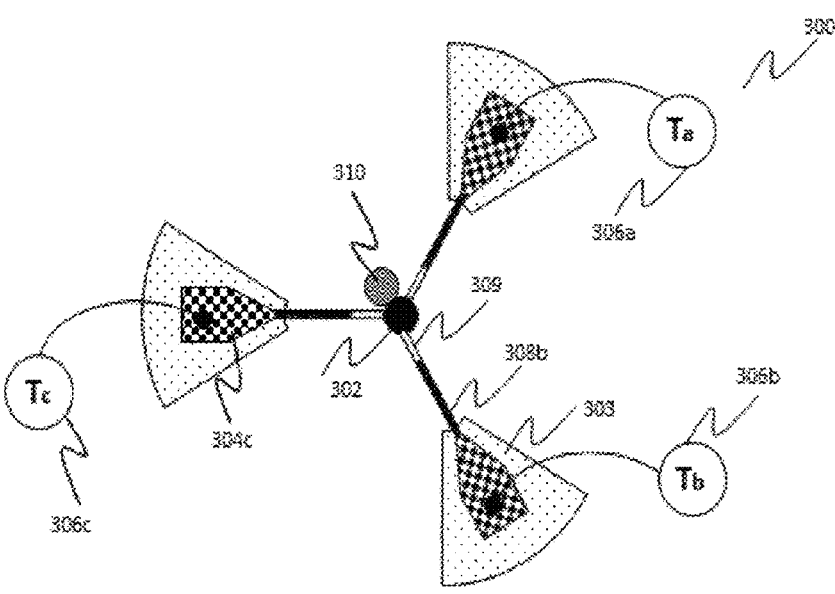
Figure 10:
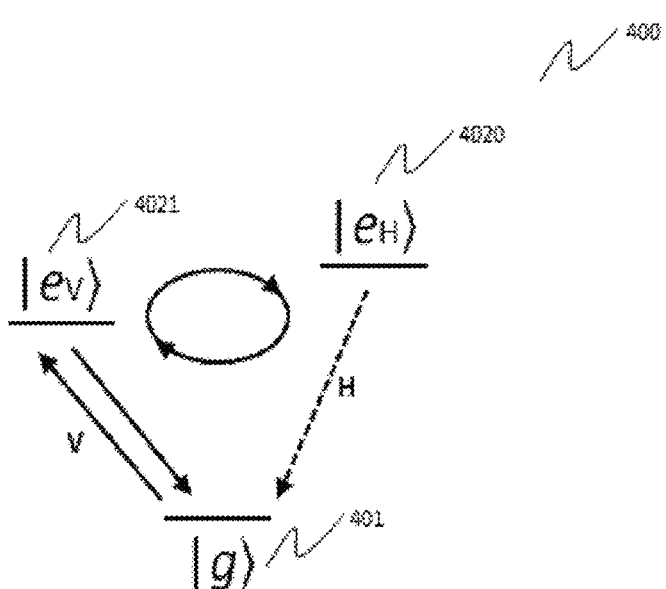
Figure 11:
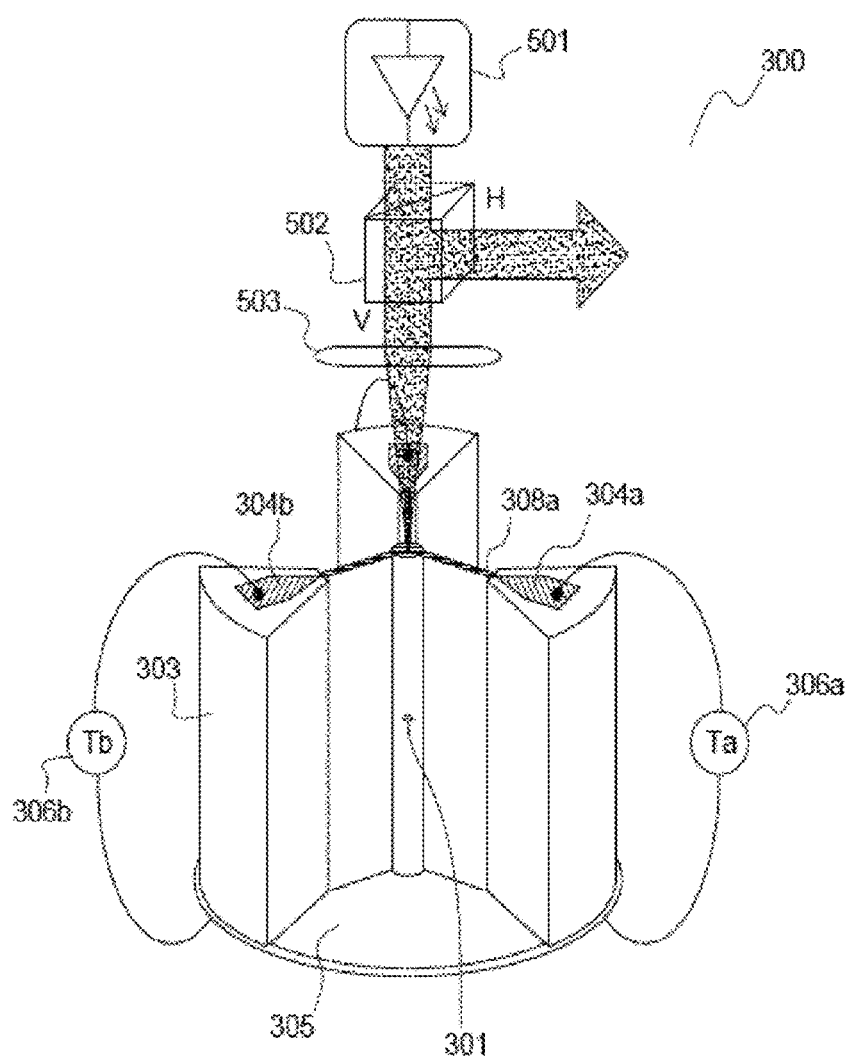
Figure 12:
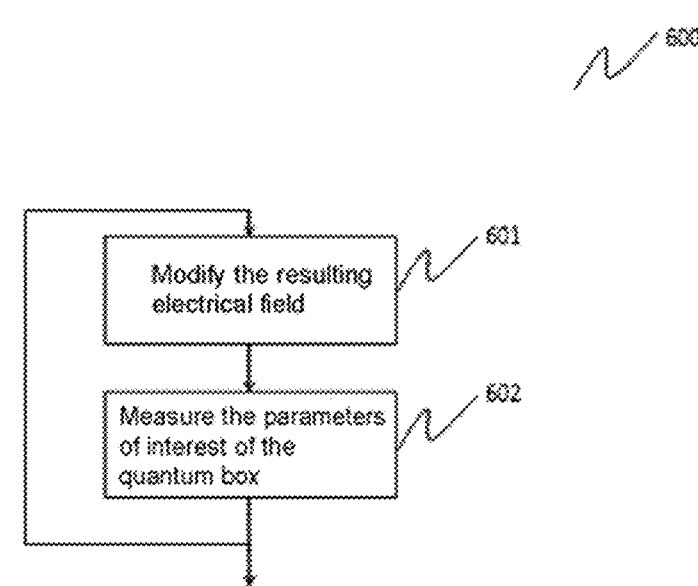

FIG. 7 represent a part of the top view of a device for generating single photons and entangled photon pairs according to different embodiments of the invention, FIG. 8 represents an optical cavity of the micro-pillar type incorporating a quantum box according to one embodiment of the invention, FIG. 9 represents a part of the top view of a device for generating single photons and entangled photon pairs implementing two optically coupled optical cavities according to another embodiment of the invention, FIG. 10 represents the change over time of the excited states of a quantum box incorporated in an optical cavity of micro-pillar type, the quantum box exhibiting a non-zero exchange anisotropy and the optical cavity exhibiting a birefringence, FIG. 11 represents the use of a device for generating single photons according to an embodiment of the invention, FIG. 12 represents a method for calibrating an anisotropic quantum box,

FIG. 13A and

Figure 13A:
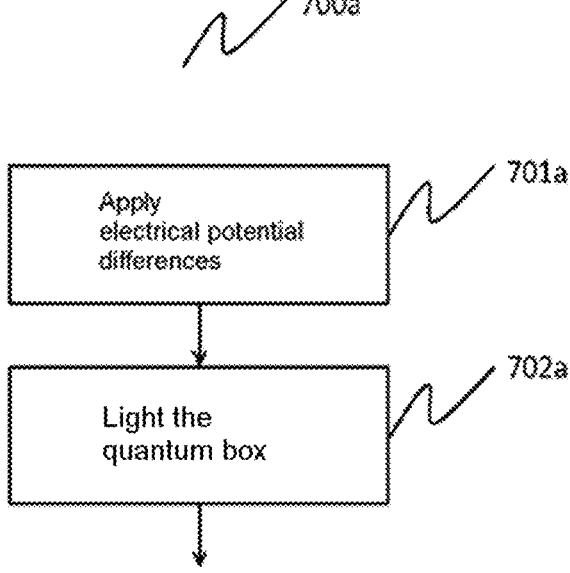
Figure 13B:
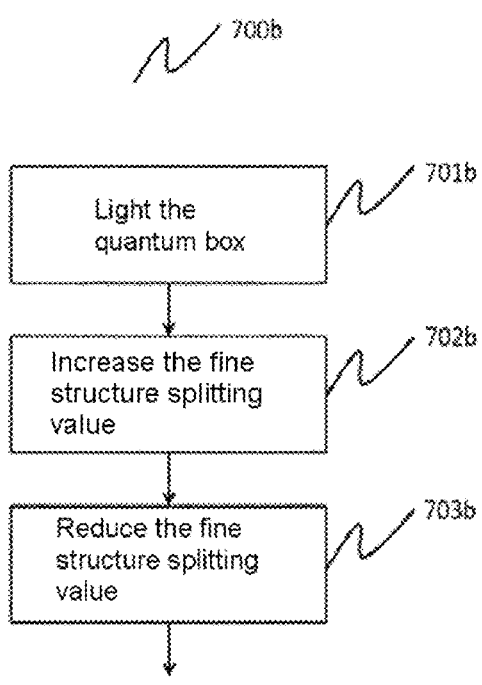
Figure 14:
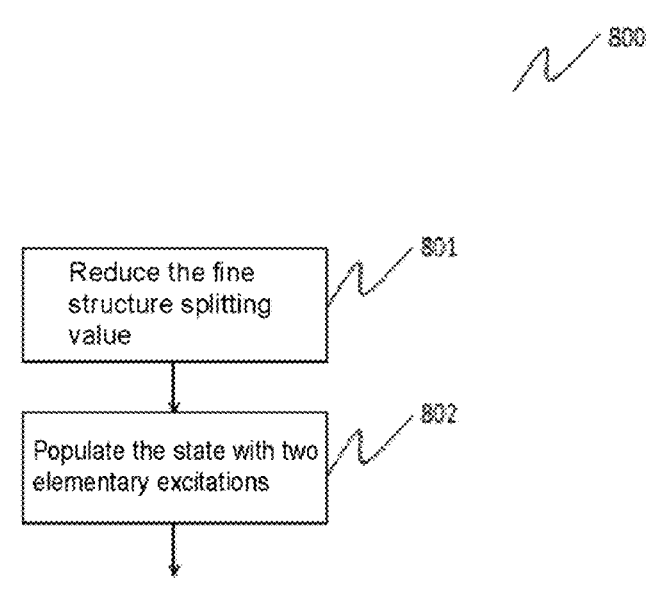
Figure 15:
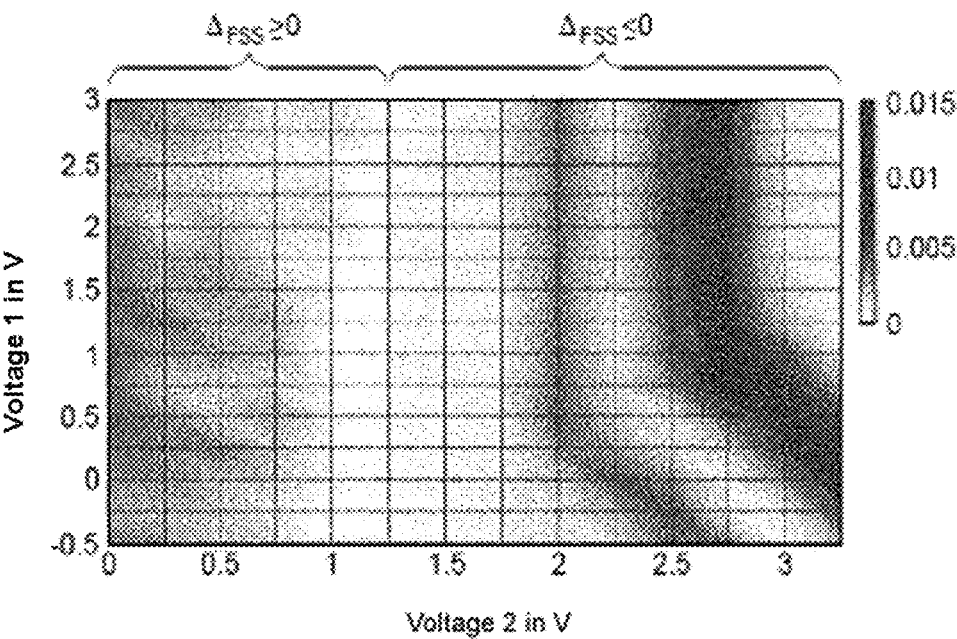

FIG. 13B represents two methods for generating single photons according to two embodiments of the invention, FIG. 14 represents a method for generating entangled photon pairs according to an embodiment of the invention, FIG. 15 represents experimental measurements of the fine structure splitting of an anisotropic quantum box subjected to an electrical field generated according to embodiments of the invention.

DETAILED DESCRIPTION

FIGS. 3A and 3B respectively represent the top view and a cross-sectional view of a device for generating single photons and entangled photon pairs 300 according to an embodiment of the invention. The device comprises a quantum box 301 inserted into an optical cavity 302 of micro-pillar type. The optical cavity 302 has a cylindrical form and is connected to three pillars 303 by semiconductor arms 308a, 308b, 308c.

The quantum box 301 can be of semiconductor nature obtained by a molecular jet growth method consisting in growing semiconductor layers that differ in terms of gap energy and mesh parameters. The layer forming the quantum box 301 can be a layer of indium arsenide (InAs) and the layers forming the substrate and the encapsulate can be layers of gallium arsenide (GaAs). The quantum box 301 can have a truncated cone form with a height of a few nanometers in the growth axis and a base diameter of some twenty nanometers. Such characteristics give the quantum box 301 properties close to those of an atom in terms of confinement of charge carriers and quantification of the energy levels.

The quantum box 301 can be in a neutral state, also called fundamental state, or in an excited state corresponding to the formation of an electron-hole pair, also called exciton or state with one elementary excitation. The formation of an exciton in the presence of a charge carrier already confined in the quantum box 301 corresponds to a trion which can be quantified as positive or negative depending on the sign of the charge carrier already confined. A biexciton, also called state with two elementary excitations, is formed in the quantum box 301 when two excitons are simultaneously confined.

The charge carriers, electrons and holes, are fermions characterized by a half-integer spin: $\pm\frac{1}{2}$ for the electrons and $\pm3/2$ for the heavy holes. The exciton state of a symmetrical quantum box 301 is bright when the electron-hole recombination is performed according to a spontaneous emission process consisting in emitting a photon. The bright exciton states, also called basic exciton states, correspond to a total angular moment equal to $\pm1$ and are relaxed by emitting a left or right circularly polarized photon depending on the sign of the sum of the spins.

In practice, the quantum box 301 is anisotropic implying a lifting of degenerescence of the exciton level of the quantum box 301. The bright exciton states in an anisotropic quantum box 301, also called eigenstates with one elementary exciton, are linear combinations of the basic exciton states as defined in a symmetrical quantum box 301 and are separated by a non-zero energy quantity called fine structure splitting.

The micro-pillar forming the optical cavity 302 is of cylindrical form and is composed of two stacks of layers 3020, 3022 surrounding a central region 3021. Such layers are typically of semiconductor nature and can be P or N doped according to a given configuration. For example, the top part of the cavity 3022 can have a P-type (or N-type) doping while the bottom part 3020 can have a doping of the opposite type, such that the cavity forms, from an electrical point of view, a PN diode. Each of the two stacks of layers 3020, 3022 forms a Bragg mirror and is obtained by alternating two layers of two different materials in terms of refractive index. The thickness and the refractive index of each of the two layers forming each of the two stacks 3020, 3022 can be chosen such that their product is equal to $\lambda/4$, $\lambda$ being the wavelength of operation. The number of pairs of layers forming the bottom stack 3020 in contact with a substrate 305 can be different from the number of pairs of layers forming the top stack 3022. Such a difference makes it possible, for example, to prioritize an upward emission of the photons generated by the quantum box 301 to increase the brightness of the photon sources 300. Each of the two Bragg mirrors 3020 and 3022 makes it possible to refract an incident light according to the layer stacking axis over a wide range of wavelengths centered around the wavelength of operation $\lambda$. The central region 3021 placed between the two stacks 3020, 3022 can have a thickness equal to $\lambda$ and is configured to contain the quantum box 301. The presence of the central region 3021 makes it possible to modify the refractivity of the micro-pillar such that the two Bragg mirrors 3020, 3022 become transmissive at the wavelength of operation. The radius of the micro-pillar is of the order of a few micrometers and is chosen so as to allow at least one optical mode, called fundamental mode, to be propagated through the micro-pillar with a minimal energy. Advantageously, the radius of the micro-pillar can be chosen so as to allow the propagation of several optical modes. The micro-pillar can have a symmetry of revolution implying two degenerate polarization states for each of the propagation modes. Alternatively, the micro-pillar is a birefringent medium in which the light is propagated anisotropically. Such a property of birefringence lifts the degenerescence of polarization of the optical propagation modes which are defined by the small axis and the large axis of the micro-pillar, respectively denoted H and V.

Advantageously, the optical cavity 302 has at least one first and one second pair of optical modes, each of the mode pairs being polarization-degenerate. An optical cavity 302 having two pairs of polarization-degenerate modes is particularly used in the generation of entangled photon pairs by matching the wavelength of relaxation from the biexciton (state with two elementary excitations) to the exciton (state with one elementary excitation) with the energy of the first pair of modes and by matching the wavelength of relaxation from the exciton to the neutral state with the energy of the second mode pair, for example.

The pillars 303 can have a height equal to, greater than or less than that of the optical cavity 302. The optical cavity 302 can be placed at the center of the assembly formed by the three pillars 303 according to a radial spacing that is sufficient to optically decouple the optical cavity 302 from the pillars 303. Furthermore, the pillars 303 must be electrically insulated from one another, except at their bottom face, correlating with the electrical contact 305 that will be addressed later. Pillars 303 can be formed by a same stacking of layers as the micro-pillar forming the optical cavity 302. Such a structure presents the advantage of being compatible with numerous clean room fabrication methods known to the person skilled in the art. The steps of fabrication of such a structure can comprise a thin layer deposition method to produce the stacking of layers, a lithography method followed by a dry etching method making it possible to define the optical cavity 302 and the three pillars 303.

The top face of each of the pillars 303, defined as being the face opposite that in contact with the substrate 305, comprises an electrical bonding pad 304a, 304b, 304c, the dimensions of which are chosen such that the electrical bonding pad 304a, 304b, 304c is completely borne by the top face of the corresponding pillar 303. The three electrical bonding pads 304a, 304b, 304c can have the same electrical properties and the same geometrical form which can be triangular, rectangular or other. The transverse dimensions of such electrical bonding pads 304a, 304b, 304c defined in a plane at right angles to the layer stacking axis (growth axis) are preferably greater by at least a factor of 10 with respect to the thickness of such pads 304a, 304b, 304c defined according to the layer stacking axis. As an example, the thickness of the electrical bonding pads 304a, 304b, 304c is chosen to be less than nanometers and their transverse dimensions are chosen to be greater than micrometers which makes it possible to facilitate their connection to the different voltage sources 306a, 306b, 306c through a wiring method, also known as "wire bonding". The electrical bonding pads 304a, 304b, 304c are arranged symmetrically around the optical cavity 302 which corresponds to a same radial spacing between each of the electrical bonding pads 304a, 304b, 304c and the optical cavity 302, and to a same angular spacing between two adjacent electrical bonding pads.

The bottom faces of the pillars 303 are connected to another electrical contact 305, the electrical contact 305 being thus borne by the bottom face of the optical cavity 302. The electrical contact 305 is made on a surface of semiconductive nature, the electrical conductivity of which is increased through a P or N doping. The electrical contact 305 can have the form of a disk, of a rectangle or of another 2D geometrical form which makes it possible to completely cover the bottom face of the assembly formed by the optical cavity 302 and the pillars 303. Such a configuration makes it possible to apply an electrical potential difference between each of the electrical bonding pads 304a, 304b, 304c arranged around the top face of the optical cavity 302 and the electrical contact 305 borne by the bottom face of the optical cavity 302 by using three independent voltage sources 306a, 306b, 306c delivering respective voltages Ta, Tb and Tc. The voltage delivered by each of the voltage sources 306a, 306b, 306c can be constant or variable over time.

Arms of semiconductor nature 308a, 308b, 308c are used to connect each of the electrical bonding pads 304a, 304b, 304c to the top face of the optical cavity 302. The materials forming the semiconductor arms are doped so as to increase their electrical conductivity, but without this conductivity becoming of metallic type (degenerate doping). The semiconductor arms 308a, 308b, 308c can have the same height as the optical cavity 302, their length is long enough to connect the outer face of the optical cavity 302 to the inner face of the pillars 303 above which the electrical bonding pads 304a, 304b and 304c are disposed, and their width is small enough for two adjacent semiconductor arms 308a, 308b, 308c to be electrically insulated from their contact with the outer face of the optical cavity 302. Each of the semiconductor arms 308a, 308b, 308c extends radially toward the corresponding pillar 303, such that an angle of 120 degrees is formed between each two adjacent semiconductor arms 308a, 308b, 308c. The use of the dielectric or semiconductor arms makes it possible to amplify the horizontal component of the applied electrical field by concentrating the field lines.

Photons generated by the quantum box 301 according to one of the optical modes and photons exciting the quantum box 301 leave and penetrate, respectively, the optical cavity 302 according to a same or two different radiation patterns 307, each of which is characterized by a given aperture angle.

The electrical potential difference between each of the electrical bonding pads 304a, 304b, 304c and the electrical contact 305 borne by the bottom face of the optical cavity 302 gives rise to an elementary electrical field and controls its characteristics in terms of intensity and orientation. The resulting electrical field which prevails in the central region 3021 and to which the quantum box 301 is subjected is the vector sum of three elementary electrical fields derived from the difference of electrical potentials between each of the three electrical bonding pads 304a, 304b, 304c arranged around the top face of the optical cavity 302 and the electrical contact 305 borne by the bottom face of the optical cavity 302. Such a resulting electrical field has three components: a vertical component defined in the same direction as the growth axis (layer stacking axis) of the optical cavity 302 and two horizontal components defined in the layer stacking plane forming the two Bragg mirrors 3020, 3022. The characteristics of such a resulting electrical field in terms of orientation and intensity can be adjusted in a deterministic manner by acting on one or more of the elementary electrical fields through the associated electrical potential difference.

FIG. 4 illustrates the generation of an electrical field with three components defined in an orthonormal trihedron by putting in place four electrical contacts according to the configuration described above, two voltage sources 306a, 306b being represented, the elementary electrical fields and the resulting electrical field being represented by dotted lines and continuous lines, respectively. The different components of the resulting electrical field make it possible to:

adjust the fine structure splitting value of the quantum box 301;

tune the emission wavelength associated with the relaxation of its bright excitonic states; and define the orientation of the specific axes of the quantum
    box 301 according to which it can emit or be excited by
    photons.

To adjust these three parameters, it is necessary to have at
least three degrees of freedom, therefore at least three
independent voltage sources linked to three non-colinear
electrical bonding pads.

From an experimental point of view, the intrinsic param-
eters of the quantum box 301, such as the fine structure
splitting, are not known precisely in advance because of the
imperfections of the fabrication methods. The parameters of
interest of the quantum box 301, such as the fine structure
splitting, the emission wavelengths and the orientations of
the specific axes, are generally measured after the produc-
tion of the device for generating single photons and
entangled photon pairs 300.

Figure 5:
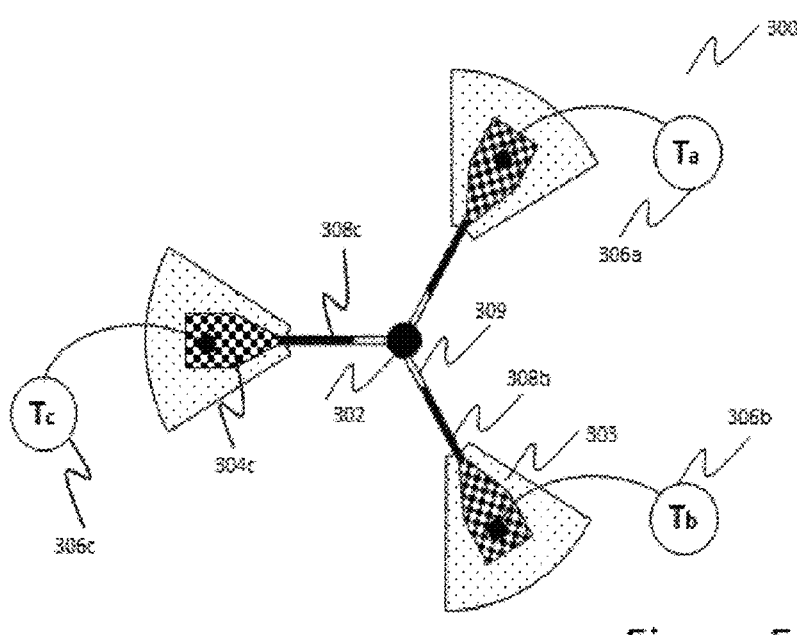

FIG. 5 represents a top view of a part of a device for
generating single photons and entangled photon pairs 300
according to another embodiment of the invention. In such
an embodiment, the semiconductor arms 308a, 308b, 308c
as described above are not in direct contact with the optical
cavity 302. The separation between each semiconductor arm
308a, 308b, 308c and the optical cavity 302 is ensured by a
layer of dielectric material 309. The layer of dielectric
material 309 is configured to ensure the electrical insulation
between the optical cavity 302 and the semiconductor arms
308a, 308b, 308c, and its thickness is of the order of a few
tens of nanometers to a few micrometers. The dielectric
material forming the dielectric layer 309 can be a void. The
electrical insulation of the optical cavity 302 from its
adjacent environment makes it possible to avoid any intense
electrical current passing through the optical cavity 302 and
disturbing the operation of the quantum box 301.

Figure 6:
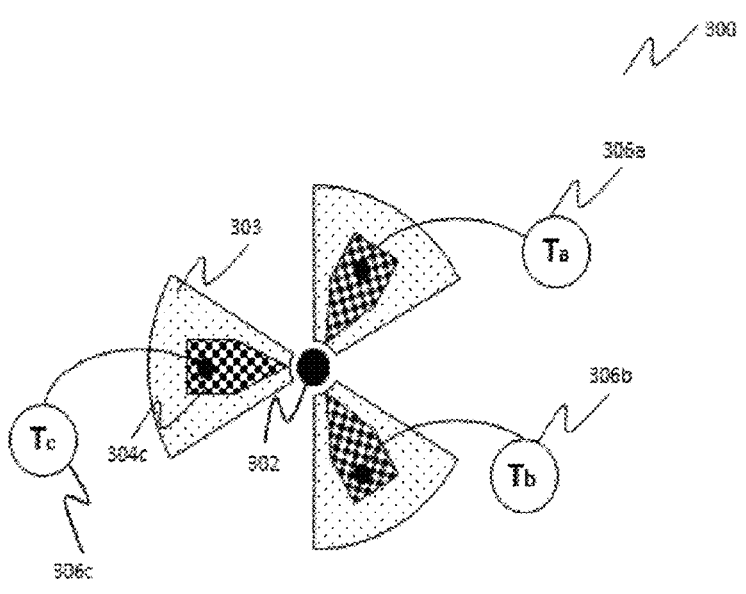

FIG. 6 represents another embodiment of the invention in
which no semiconductor arm is used to connect the optical
cavity 302 to the different pillars 303 implemented. In such
an embodiment, the pillars 303 are disposed symmetrically
around the optical cavity 302 and the radial spacing between
the optical cavity 302 and each of the pillars 303 is chosen
to be less than 10 micrometers, for example. Such a radial
spacing makes it possible to subject the quantum box 301 to
an electrical field that is intense enough to act on the
characteristic parameters of the quantum box 301 including
the fine structure splitting value. The separation between the
optical cavity 302 and the pillars 303 can be ensured by a
dielectric material or by a void.

FIG. 7 represents another embodiment of the invention
according to which the electrical bonding pads 304a, 304b,
304c are borne by a hollow structure 3030 of cylindrical
form surrounding the optical cavity 302. The hollow struc-
ture 3030 can be formed by a dielectric material which
allows the electrical insulation between the electrical bond-
ing pads 304a, 304b, 304c. The hollow structure 3030 can
have the same height as the optical cavity 302 and its top
surface is chosen to be wide enough to contain the electrical
bonding pads 304a, 304b, 304c. Furthermore, semiconduc-
tor arms 308a, 308b, 308c associated with a layer of
dielectric material 309 as described in the embodiment of
FIG. 5 are used to connect the electrical bonding pads 304a,
304b, 304c to the optical cavity 302. Alternatively, the
connection between the electrical bonding pads 304a, 304b,
304c and the optical cavity 302 can be ensured by bringing
the electrical bonding pads 304a, 304b, 304c sufficiently
close to the optical cavity 302 as described in FIG. 6 or by
using semiconductor arms 308a, 308b, 308c as described in
FIGS. 3A and 3B.

FIG. 8 represents the structure of an optical cavity 302 of
micro-pillar type according to an embodiment of the inven-
tion. In such an embodiment, the two top 3022 and bottom
3020 Bragg mirrors forming the micro-pillar are P and N
doped, respectively. The central region 3021 containing the
quantum box 301 remains intrinsic such that the micro-pillar
forms, from an electrical point of view, a diode of P-I-N
type. The concentration of the impurities used to produce the
doping (P or N) can be uniform over the length of each of
the two Bragg mirrors 3020, 3022. Alternatively, the con-
centration of the impurities can change in a decreasing
manner so as to be minimal in the regions in contact with the
central region 3021. The change of concentration of the
impurities can be linear, logarithmic, or other. Advanta-
geously, the different voltages applied to the optical cavity
302 doped according to one of the configurations described
above correspond to a reverse polarization of the P-I-N
junction formed by the optical cavity 302. Such a reverse
polarization guarantees that no significant electrical current
passes through the quantum box 301 and disturbs its emis-
sion of photons. Alternatively, the optical cavity 302 is
forward biased which generates a significant electrical cur-
rent passing through the quantum box 301 and which is
likely to disturb its operation.

According to embodiments of the invention, each of the
electrical bonding pads 304a, 304b, 304c surrounding the
top face of the optical cavity 302 is connected to one of the
terminals of an adjustable voltage source 306a, 306b, 306c.
Each of the adjustable voltage sources 306a, 306b, 306c is
configured to apply an electrical potential difference
between the electrical bonding pad 304a, 304b, 304c to
which it is connected and the electrical contact 305 borne by
the bottom face of the optical cavity 302 which is common
to all the adjustable voltage sources 306a, 306b, 306c
implemented. The voltage generated by each of the adjust-
able voltage sources 306a, 306b, 306c measured between
the corresponding electrical bonding pad 304a, 304b, 304c
and the electrical contact 305 can be positive, zero or
negative.

FIG. 9 represents a top view of a device for generating
single photons and entangled photon pairs 300 comprising
two optical cavities 302, 310 according to another embodi-
ment of the invention. One of the two optical cavities 302
comprises the quantum box 301 and can be configured
according to one of the embodiments described above. The
other optical cavity 310 does not comprise any quantum
boxes and can have opto-geometrical parameters (size,
form) that are different from those of the first optical cavity
302. The two optical cavities 302, 310 implemented are
configured so as to be coupled optically according to a given
coupling force. The assembly formed by the two optical
cavities 302, 310 has two pairs of polarization-degenerate
optical modes. The first pair of polarization-degenerate
optical modes is configured to be in resonance with the
transitions between the state with two elementary excitations
(biexciton) and the two states with one elementary excitation
(exciton). The second pair of polarization-degenerate optical
modes is configured to be in resonance with the transitions
between the two states with one elementary excitation
(exciton) and the fundamental state, also called neutral state,
of the quantum box 301. The modes of each of the pairs of
optical modes have radiation patterns 307 that overlap to
70% or more. The coupling between the two optical cavities
302, 310 can also be configured according to the embodi-
ments described in the patent application [3].

According to embodiments of the invention, the number
of electrical bonding pads arranged around the top face of the optical cavity 302 is greater than three. Such a number of electrical bonding pads can be even or odd and can be less than 20. The electrical bonding pads can be arranged in a non-symmetrical manner around the optical cavity 302 such that at least three electrical bonding pads, and possibly their associated semiconductor arms, are not oriented in pairwise parallel directions. This means that the angular space between the adjacent electrical bonding pads and the radial spacing, measured from the optical cavity 302, can be not constant for all the electrical bonding pads implemented. Furthermore, the electrical bonding pads can be placed at different distances from the electrical contact 305, that is to say that the electrical bonding pads can be placed in different planes at right angles to the layer stacking axis.

According to embodiments of the invention, the device for generating single photons and entangled photon pairs 300 can comprise a cooling unit, for example with Peltier effect or by nitrogen or helium cryogenics, configured to control and keep constant the operating temperature of the quantum box 301. Such an operating temperature can lie between 4 kelvins and 100 kelvins. Such low operating temperatures limit the interaction between the quantum box 301 and its adjacent environment and make it possible to maintain the consistency of the excited state with the fundamental state over a time interval that is long enough to manipulate the state of the quantum box 301.

FIG. 10 illustrates the change over time 400 of the bright excitonic states in a quantum box 301 inserted into an optical cavity 302 of micro-pillar type, the quantum box 301 and the optical cavity 302 being characterized by a non-zero anisotropy. The anisotropy of the optical cavity 302 implies a lifting of the degenerescence of the modes of the optical cavity 302 with a low-energy mode and a high-energy mode matched with the specific axes of polarization of the micro-pillar, H and V. The anisotropy of the quantum box 301 implies a lifting of the degenerescence between the two excited states which become separated by a non-zero energy quantity called fine structure splitting. Each of the two excited states, also called eigenstates, of the quantum box 301, is associated with a given linear polarization state, X or Y, according to which it can emit or be excited by a photon. Generally, the modes of the optical cavity 302, H and V, do not coincide with the directions of polarization of the quantum box 301, x and y, and an angle, denoted 8, can be defined to quantify such a mismatch. The resonant excitation of the exciton level of the quantum box 301 by linearly polarized photons according to one of the modes of the optical cavity 302, H or V, leads to the excitation of the two eigenstates according to a weighting which depends on the value of the angle θ. Such a result in excited state, 4021 or 4020, is not stable and its phase changes over time with a speed of transfer proportional to the fine structure splitting value. Such behavior can be exploited to collect only the single photons generated by the quantum box 301 by exciting it with photons that are polarized linearly according to the axis H of the optical cavity 302, for example, and by collecting only the photons generated according to a linear polarization state at right angles to that used in the excitation, the axis V of the optical cavity 302, in this case. In such configurations, increasing the fine structure splitting value makes it possible to have photons emitted in the direction of polarization of detection before they are spontaneously emitted in the direction of polarization of excitation. In a second stage, the fine structure splitting value should be reduced in order to limit the probability of having two photons emitted instead of one within one and the same excitation area.

FIG. 11 represents a device for generating single photons 300 according to an embodiment of the invention. Such an embodiment implements an anisotropic quantum box 301 incorporated in a birefringent optical cavity 302 of micro-pillar type. The quantum box 301 is subjected to an electrical field that is adjustable in intensity and in orientation through electrical bonding pads 304a, 304b, 304c, 305 arranged according to one of the embodiments described above, the pad 304c and the associated voltage source 306c being concealed in FIG. 11. The device for generating single photons 300 comprises an exciting laser source 501 configured to generate light pulses intended to optically pump the quantum box 301 so as to transform its state from a neutral state to an excited state. The state of polarization of the light pulses is linear according to one of the specific axes of the optical cavity 302 and the associated wavelength is chosen such that the energy transported by the photons is sufficiently great to excite the quantum box 301. The duration of the light pulses and their repeat frequency determines the rate in number of photons per second generated by the device for generating single photons 300. The device for generating single photons 300 further comprises a polarization splitter cube 502 and a convergent lens 503 configured respectively to isolate the photons generated in the optical cavity 302 according to a linear polarization state in a direction at right angles to that of the excitation photons and to improve the optical coupling between the polarization splitter cube 502 and the optical cavity 302. The specific axes of the optical cavity 302, H and V, are configured not to be colinear with the specific axes of the quantum box 301, x and y, according to an angle θ, ideally equal to 45 degrees.

FIG. 12 represents a method for calibrating 600 an anisotropic quantum box 301 subjected to an electrical field as illustrated in FIG. 4. The three components in the space of the resultant electrical field are independently adjustable by means of at least three adjustable voltage sources. The method is iterative and consists, on each iteration, in modifying the intensity of at least one of the three components of the resultant electrical field (step 601) and in measuring, in a second stage, the characteristic parameter or parameters of interest of the quantum box 301 that are associated with the resultant electrical field applied (step 602). The method can be stopped when the desired values of the characteristic parameters of interest are obtained and can return the values of the voltages applied to the different electrical bonding pads. The first iteration of the method can correspond to a resultant electrical field of zero intensity.

The calibration method can be used to identify the operating point of a device for generating entangled photon pairs 300. The characteristic parameters of interest for such a device comprise the fine structure splitting which must be significantly reduced ideally set to zero, and the emission wavelengths corresponding to the relaxation of the biexciton and the relaxation of the exciton.

The calibration method can further be used to find an optimal operating point of a device for generating single photons 300 operating in a static mode according to which the fine structure splitting characterizing the anisotropic quantum box 301 implemented is adjusted statically before the creation of any exciton. The fine structure splitting must allow a speed of transfer that is sufficient for the excited state to be able to be relaxed according to a linear polarization state at right angles to that of the exciting photons at the end of a transfer time that is less than the duration of the excitation optical pulse. The fine structure splitting can further be optimized so that:

it is greater than a lower limit from which the excited state can be relaxed, according to a linear polarization state at right angles to that of the exciting photons, at the end of a transfer time that is less, at least by a factor of 3 and preferably by at least a factor of 5, than the lifespan by spontaneous emission of the excitonic state;

it is less than an upper limit from which the quantum box 301 can emit more than one photon during the duration of the excitation optical pulse.

FIG. 13A is a flow diagram of a method for generating single photons 700a by means of the device for generating photons 300 according to an embodiment of the invention. In such an embodiment, the fine structure splitting characterizing the anisotropic quantum box 301 implemented is adjusted statically. The first step of the method 701a consists in applying, between each of the electrical bonding pads 304a, 304b, 304c and the electrical contact 305 borne by the bottom face of the optical cavity 302, an electrical potential difference so as to generate a resultant electrical field to which the quantum box 301 is subjected. The components of such a resultant electrical field are adjusted so as to optimize the fine structure splitting value as described above. In addition to matching the wavelength of the single photons generated by the quantum box 301, the application of the resultant electrical field in the three directions of space makes it possible to define the orientations of the specific axes of the quantum box 301 so as not to be colinear with the specific axes of the optical cavity 302 in which the quantum box 301 is inserted. Advantageously, the specific axes of the quantum box 301 are oriented at 45 degrees with respect to the specific axes of the optical cavity 302.

The second step of the method 702a consists in lighting the quantum box 301 by a train of light pulses of which the wavelengths spectrum and the polarization state correspond to one of the modes of the optical cavity 302 in which the quantum box 301 is inserted. The duration of the light pulses is chosen so as to be long enough to excite the quantum box 301 and be able to emit at least one photon according to the spontaneous emission process.

FIG. 13B is a flow diagram of a method for generating single photons 700b by means of the device for generating photons 300 according to another embodiment of the invention. In such an embodiment, the fine structure splitting characterizing the anisotropic quantum box 301 is controlled dynamically. Such dynamic control is performed through a modulation of the resultant electrical field to which the quantum box 301 is subjected so as to be able to modify the fine structure splitting value within a time interval less than the spontaneous emission time characterizing the quantum box 301.

The first step of the method 701b consists in lighting the quantum box by a train of light pulses of which the wavelengths spectrum and the polarization state correspond to a mode of the optical cavity 302 incorporating the quantum box 301. The duration of the light pulses is chosen so as to be long enough to excite the quantum box and be able to emit at least one photon according to the spontaneous emission process.

The second step of the method 702b consists in applying an electrical potential difference between each of the electrical bonding pads 304a, 304b, 304c and the electrical contact 305 borne by the bottom face of the optical cavity 302 so as to generate a resultant electrical field to which the quantum box 301 is subjected. The fine structure splitting value increases as a function of the intensity of the resultant electrical field which must remain lower than a threshold corresponding to damage to the quantum box 301, that is to say a threshold from which the electrical and optical characteristics as determined during the calibration of the quantum box 301 can no longer be reestablished. The intensity of the resultant electrical field is chosen to be fairly high for the change over time of the phase of the excited state created to lie between 45 degrees and 135 degrees, and preferably between degrees and 100 degrees. Such a change over time of the phase must also occur within a time that is less (at least by a factor of 3 and preferably by at least a factor of than the lifespan by spontaneous emission of the excitonic state.

The third step of the method 703b can be triggered immediately after the change over time of the phase of the initial excitonic state as requested is completed. Such a step of the method consists in modifying the intensity of the resultant electrical field so as to minimize the energy deviation between the two eigenstates with one elementary excitation.

FIG. 14 represents a method for generating entangled photon pairs 800 by means of a device for generating photons 300 according to an embodiment of the invention. Such a device for generating photons 300 implements an anisotropic quantum box 301 incorporated in an optical cavity 302 having at least one first pair and one second pair of optical modes, each of the pairs of optical modes being polarization-degenerate. The entanglement of the photons generated is obtained by virtue of a static control of the fine structure splitting characterizing the anisotropic quantum box 301 implemented. The first step of the method 801 consists in applying an electrical potential difference at each of the electrical bonding pads 304a, 304b, 304c and the electrical contact 305 borne by the bottom face of the optical cavity 302. Such electrical potential differences are optimized so as to reduce the energy deviation between the two states with one elementary excitation defined by the fine structure splitting of the quantum box 301. In particular, the step 801 can consist in canceling the fine structure splitting which makes the quantum box 301 a system with three energy levels relative to the relaxation of a biexciton. The electrical potential differences are also set so that:

the transition between the state with two elementary excitations and the states with one elementary excitation are in resonance with the first pair of modes of the optical cavity 302; and the transition between the states with one elementary excitation and the fundamental state is in resonance with the second pair of modes of the optical cavity 302.

The second step of the method 802 consists in populating the state with two elementary excitations of the quantum box 301 by an input of energy. The creation of such a biexcitonic state XX can be produced by exciting the quantum box 301 by two successive photons of suitable energies: a first photon of energy $\omega_x$ that is sufficient to excite the transition of a first exciton and a second photon of energy $\omega_{xx}$ different from $\omega_x$ to create a second exciton and thus obtain a biexcitonic state XX, or, alternatively, two photons of energy $(\omega_{xx}+\omega_x)/2$.

FIG. 15 illustrates experimental measurements of the fine structure splitting characterizing an anisotropic quantum box 301 incorporated in an optical cavity 302 of micro-pillar type, the top face of the optical cavity 302 being surrounded by two electrical bonding pads 304a, 304b according to embodiments of the invention. The experimental measurements are performed for two voltage ranges applied to the electrical bonding pads 304a, 304b and illustrate the technical advantages of the embodiments of the invention in terms of deterministic control of the fine structure splitting value. Such measurements are obtained for the following configuration: the quantum box 301 is excited by a laser of energy greater than the optical transition corresponding to the exciton. This non-resonant excitation makes it possible to populate the two excitonic states 2020 and 2021 which then emit photons at two different wavelengths which are collected. The difference in wavelengths between the two photons makes it possible to extract the fine structure splitting value. FIG. 15 shows the result of such a measurement where color scale reflects the absolute value of the fine structure splitting, as a function of two voltages applied to the contacts 304a and 304b. The figure shows that the fine structure splitting changes in absolute value as a function of the voltages applied and changes sign by being canceled out for an entire range of voltage 1 and voltage 2 pairings.

According to an embodiment of the invention, the formation of an exciton in a quantum box 301 that is initially neutral is performed by a non-resonant optical pumping consisting in exciting the quantum box 301 by a photon of energy greater than the stop band of the material forming the quantum box 301.

According to another embodiment of the invention, the geometric form of the micro-pillar forming the optical cavity 302 defined in the plane at right angles to the growth axis can be elliptical, polygonal or other.

The invention is not limited to the embodiments described above as nonlimiting examples. It encompasses all the variant embodiments which will be able to be envisaged by the person skilled in the art.

REFERENCES

[1] Trotta, Rinaldo et al. "Highly Entangled Photons from Hybrid Piezoelectric-Semiconductor Quantum Dot Devices." Nano Letters 14.6 (2014): 3439-3444.
[2] K Kowalik, O Krebs, A Lemaitre, S Laurent, P Senellart, P Voisin, J A Gaj "Influence of an in-plane electric field on exciton fine structure in InAs-GaAs self-assembled quantum dots." Applied Physics Letters 86 (4), 041907
[3] WO/20111/089336 "SOURCE OF POLARIZATION-ENTANGLED PHOTON PAIRS AND METHOD FOR MANUFACTURING SAME".

The invention claimed is:

1. A device for generating photons comprising:
a quantum box inserted into a first optical cavity having at least one optical mode and forming a diode, the quantum box having a fundamental state, two states with one elementary excitation, and a state with two elementary excitations, the quantum box being situated in an intrinsic region of the diode, the first optical cavity having a bottom face and a top face, the bottom face bearing an electrical contact;
at least three electrical bonding pads that are electrically insulated from one another, arranged around the top face of the first optical cavity; and
at least three adjustable voltage sources for applying respective and variable potential differences between each of said electrical bonding pads and the electrical contact borne by the bottom face of the first optical cavity.

2. The device as claimed in claim 1, wherein the electrical bonding pads are linked to the top face of the first optical cavity by semiconductor arms that are oriented radially with respect to the first optical cavity and that have, in a tangential direction and, at their end closest to the optical cavity, a width less than that of the first optical cavity.

3. The device as claimed in claim 1, wherein the electrical bonding pads are linked to semiconductor arms oriented radially toward the first optical cavity and of which the ends are separated from the top face of the first optical cavity by an empty gap.

4. The device as claimed in claim 1, wherein the electrical bonding pads are borne by respective pillars decoupled optically and electrically from the first optical cavity.

5. The device as claimed in claim 1, wherein the first cavity has at least one first and one second pair of modes, each said pair of modes being polarization degenerate.

6. The device as claimed in claim 5, further comprising:
a second optical cavity coupled to the optical cavity into which the quantum box is inserted, the geometry of the first optical cavity and geometry of the second optical cavity and the force of their coupling result in an assembly composed of the two coupled cavities having a first pair of modes that are polarization degenerate and resonant with transitions between the state with two elementary excitations and the two states with one elementary excitation of the quantum box and a second pair of modes that are polarization degenerate and resonant with the transitions between the two states with one elementary excitation and the fundamental state of the quantum box, the modes of each of said pairs having radiation patterns that overlap by 70% or more.

7. The device as claimed in claim 6, wherein the first optical cavity and the second optical cavity are arranged side-by-side.

8. A method for generating entangled photon pairs by means of the device as claimed in claim 6, the method comprising:
applying a potential difference between each of said electrical bonding pads and the electrical contact borne by the bottom face of the first optical cavity, said potential differences being chosen to:
minimize an energy difference between the two states with one excitation of the quantum box; and
bring the transitions between the state with two elementary excitations and the states with one elementary excitation into resonance with the first pair of modes of the first optical cavity, and the transitions between the states with one elementary excitation and the fundamental state into resonance with the second pair of modes of the first optical cavity, and
populate the state with two elementary excitations of the quantum box with an input of energy.

9. The method for generating single photons by means of the device as claimed in claim 1 comprising:
applying a potential difference between each of said electrical bonding pads and the electrical contact borne by the bottom face of the first optical cavity; and
lighting the quantum box of the device by a light pulse exhibiting a spectrum and a direction of polarization corresponding to a mode of the first optical cavity; said potential differences being chosen to modify the energies of the two eigenstates with one elementary excitation in such a way that:
said states are resonant with wavelengths of the spectrum of the light pulse; and the probability of emission, by the quantum box, of a single photon exhibiting a linear polarization orthogonal to that of the lighting is maximized.

10. The method as claimed in claim 9, wherein said potential differences are also chosen to orient specific axes of the quantum box according to intermediate directions between those of two specific axes of polarization of the first optical cavity.

11. The method as claimed in claim 9, wherein said potential differences are variable in time, and:

during a first period, during at least a part of which the quantum box is lit, take first values chosen for the energies of the two eigenstates with one elementary excitation to exhibit a non-minimal deviation, the first period having a duration chosen to provoke a change of phase of between 45° and 135° between the two said states; and during a second period, immediately succeeding the first period, take values chosen to minimize the deviation between the energies of the two eigenstates with one elementary excitation.

12. The method of claim 11, wherein the first period has a duration chosen to provoke a change of phase of between 80° and 100° between the two said states.

13. The device as claimed in claim 1, wherein the electrical bonding pads are linked to semiconductor arms oriented radially toward the first optical cavity and of which the ends are separated from the top face of the first optical cavity by a gap filled with dielectric of sub-micrometric width.

\* \* \* \* \*